July 26, 1966 B. D. BEDFORD 3,263,099

POWER AMPLIFIER CIRCUIT

Filed May 25, 1962 2 Sheets-Sheet 1

Inventor
Burnice D. Bedford
by Paul A. Frank
His Attorney

July 26, 1966 B. D. BEDFORD 3,263,099

POWER AMPLIFIER CIRCUIT

Filed May 25, 1962 2 Sheets-Sheet 2

Inventor:
Burnice D. Bedford,
by Paul A. Frank
His Attorney.

3,263,099
POWER AMPLIFIER CIRCUIT

Burnice D. Bedford, Scotia, N.Y., assignor to General Electric Company, a corporation of New York Filed May 25, 1962, Ser. No. 197,626
4 Claims. (Cl. 307—109)

My invention relates to a novel electrical power amplifier circuit, and in particular, to a power amplifier circuit wherein the output voltage may exceed the supply voltage without employing a transformer to obtain the voltage increase.

In many electrical power supply applications, an output voltage is required that exceeds the available supply voltage. The conventional means for obtaining a higher output voltage is to utilize a step-up power transformer within the power amplifier circuit. However, in specific applications such as power supplies on aircraft or space vehicles, where light weight and fast response are of prime consideration, the use of a power transformer is not desirable. Further, a power transformer cannot provide an accurately controllable step-up voltage ratio, but is limited to a finite number of ratios and is not applicable to both alternating and direct current circuits. Thus, there is a need for a power amplifier circuit that accomplishes an increase in output voltage over the supply voltage without utilizing a power transformer to perform this function.

It is therefore, a primary object of my invention to develop a novel power amplifier circuit which provides an output voltage higher than the supply voltage without employing power transformers.

In its broadest aspect, my invention consists in developing an electrical circuit that comprises a means for storing electrical energy and a switching means for transferring the stored energy to an output circuit. The switching means comprises a circuit that is rendered intermittently conductive and nonconductive, the time interval of the conductive and nonconductive states determining the magnitude of the output voltage.

The features which I desire to protect herein are pointed out with particularity in the appended claims. The invention itself, together with further objects and advantages thereof may best be understood by reference to the following description taken in connection with the accompanying drawings, wherein like parts in each of the several figures are identified by the same reference character, and wherein:

Figure 1:
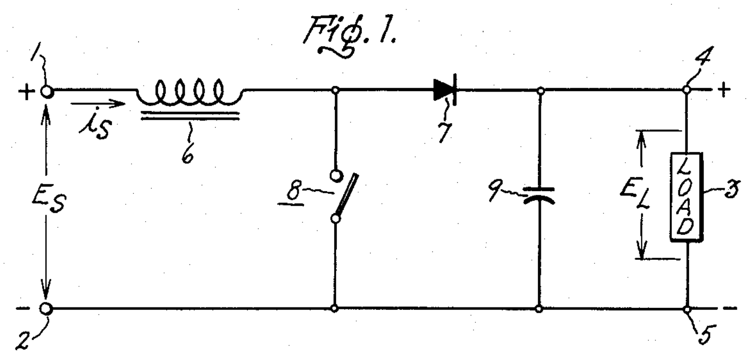
FIGURE 1 is a simplified schematic circuit diagram of a power amplifier circuit constructed in accordance with my invention, the switching means being represented by a mechanical switch.

Referring particularly to the simplified schematic circuit diagram illustrated in FIGURE 1, therein is shown a pair of input terminals 1, 2, which are adapted to be connected to a source of voltage and to provide an input or supply voltage $E_S$ to the power amplifier circuit. An output or load voltage $E_L$ for load 3 is developed across output terminals 4, 5. A linear magnetic core inductor 6, of the type used in power supply filter networks, and a blocking diode 7, are connected in series between input terminal 1 and output terminal 4. The remaining terminals 2, 5 are connected together to form a common reference point. A switching means, illustrated as a mechanical switch 8, has one end connected intermediate inductor 6 and diode 7 and the other end connected to the common reference point joining terminals 2 and 5. A filter capacitor 9 is connected across output terminals 4 and 5 in parallel with load 3. Although switching means 8 is disclosed as a mechanical switch for purposes of illustration in this simplified schematic circuit diagram, it is to be understood that this switching means is in reality a controlled circuit to be hereinafter described, with the time intervals of the open and closed or nonconductive and conductive states of the switching means being regulated by the controlled circuit. Inductor 6 and switching means 8, together with input terminals 1, 2 form an input circuit which permits electrical energy from the source to be stored within inductor 6 when switching means 8 is closed. Switching means 8 in series with diode 7 and the parallel combination of load 3 and capacitor 9, form an output circuit which is adapted to transfer the stored electrical energy from inductor 6 to capacitor 9 and to load 3 when switching means 8 is opened. If switching means 8 is rendered closed and open, or conductive and nonconductive at a rapid rate, the arrangement of the filter inductance 6 and filter capacitor 9 provides a smooth flow of current from input terminals 1, 2 to load 3. The increase or step-up in output voltage over input voltage is accomplished in the following manner: Neglecting losses in the circuit components, when switching means 8 is closed for a time $t_{sc}$ and open for a time $t_{so}$, the energy stored in inductor 6 is $E_S i_s t_{sc} = (E_L - E_S) i_s t_{so}$ which is the energy transferred from inductor 6 to capacitor 9 and the load 3, where $i_s$ is the current flowing through inductor 6 and is assumed to be constant. From the foregoing equation, it can be appreciated that load voltage $$E_L = E_S(t_{sc}/t_{so}) + E_S$$

The ratio of the time intervals of closed to open states of switching means 8, $t_{sc}/t_{so}$ is regulated by a controlled circuit to be hereinafter described, thus providing a load voltage $E_L$ which always exceeds the supply voltage $E_S$ whenever the ratio $t_{sc}/t_{so}$ is greater than zero. If switching means 8 is never closed, so that $t_{sc}=0$, then load voltage $E_L$=supply voltage $E_S$. In many applications, time interval $t_{sc}$ is controlled within the range from $t_{sc}=0$ to $t_{sc}=t_{so}$, thereby providing a load voltage wherein load voltage $E_L$ is within the range from $E_L=E_S$ to $E_L=2E_S$, as illustrated in FIGURE 3. Switching means 8 may be controlled to provide a ratio of $t_{sc}/t_{so}$ greater than one, whereby load voltage $E_L$ exceeds $2E_S$. However, in such a case the switching losses of the switching means then exceed the switching losses employed by a conventional inverter and transformer arrangement to obtain the increase in voltage. Therefore, the circuit as illustrated in FIGURE 1 (and FIGURES 2 and 4) would be generally employed for power amplifier circuits wherein the load voltage would not be more than twice the supply voltage.

The losses in the circuit components of FIGURE 1 result in load voltage $E_L$ being slightly less than heretofore indicated. The minimum inductance value of inductor 6 is limited by switching means 8 since if the inductance is too low, the ripple component of current $i_s$ becomes excessive and prevents switching means 8 from functioning properly.

Capacitor 9 acts to reduce the ripple component of the current flowing at load 3, and diode 7 insures that capacitor 9 will discharge only through the load circuit. The arrangement of inductor 6 thus provides both a smooth flow of current from the input terminals to the load circuit and also a means for stepping up the output voltage. The smooth current flow produces an effective isolation between the input power source and the power amplifier, thereby minimizing any disturbances that could be reflected from one circuit to the other.

Figure 2:
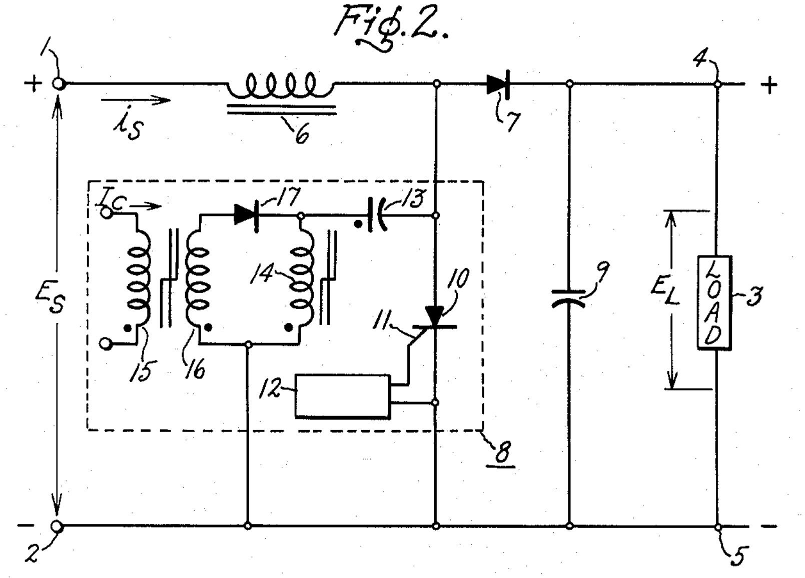
FIGURE 2 is a schematic circuit diagram of the circuit of FIGURE 1, showing an embodiment of the switching means in detail.
Figure 3:
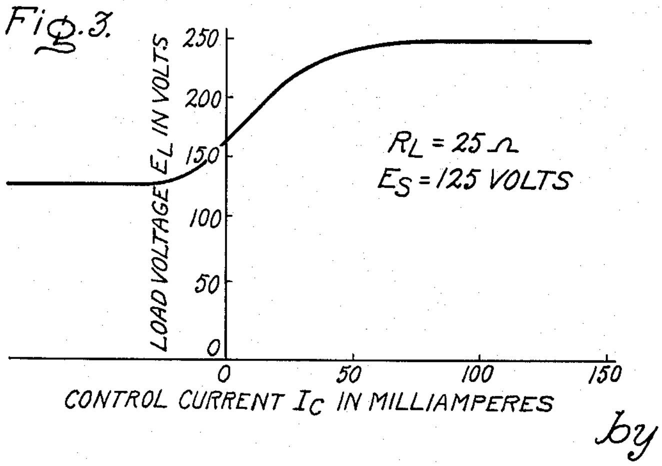
FIGURE 3 represents a characteristic curve of the load voltage obtained in response to a control current applied to the input of the switching means shown in FIGURE 2, with the supply voltage held constant.

In FIGURE 2 therein is disclosed one embodiment of the details of switching means 8. It must be remembered that the circuit representing switching means 8 may take any one of a number of forms, the requirements of the circuit being that it be capable of being rendered fully conductive or nonconductive for predetermined time intervals $t_{sc}$ and $t_{so}$, respectively, and that this switching action be accomplished with consistency. Another requirement is that the switching means be capable of conducting and interrupting the line current $i_s$. A unidirectional conducting device whose conduction and nonconduction times may be accurately controlled, provides a convenient means for obtaining the switching action. A silicon controlled rectifier designated as a whole by numeral 10, having a gate electrode 11, a cathode, and an anode, may be conveniently employed for the intermittently conductive device. A conventional silicon controlled rectifier is a PNPN solid state semiconductor device possessing properties similar to that of the gaseous thyratron or ignitron wherein once the device has been rendered conductive by application of a small gating signal to the gating electrode, the gating electrode thereafter loses control of conduction through the device.

Controlled rectifier 10 is rendered conductive by a signal supplied by a gating signal source 12 which supplies gating signal pulses having a fixed repetition rate to gating electrode 11. Gating signal source 12 may comprise any conventional square wave or pulsed signal source capable of supplying gating pulses at a constant frequency which by way of example and not limitation, may be 2000 cycles per second and having a pulse duration sufficient to render the controlled rectifier 10 conductive. The gating signal source may conveniently be a conventional unijunction transistor oscillator circuit as described in detail in a publication entitled, "Silicon Controlled Rectifier Manual," second edition, pages 44 through 47, copies of which may be obtained from the Rectifier Components Department of the General Electric Company, Auburn, New York.

Controlled rectifier 10 is rendered nonconductive by a control circuit connected in parallel with the controlled rectifier. One portion of the control circuit merely renders the rectifier nonconductive and includes a series circuit comprised by charging capacitor 13 and saturable reactor 14. The conducting time interval of rectifier 10 is controlled by employing a circuit comprising a saturable core transformer having a primary winding 15, a secondary winding 16, with one end of the secondary winding being connected through a blocking diode 17 to the junction of saturable reactor 14 and charging capacitor 13. Reactor 14 and transformer 15, 16 are designed to have substantially square hysteresis loops. The primary winding 15 of the saturable core transformer is connected to a source of control current $I_C$.

The control circuit operates to periodically apply a potential of reverse polarity from capacitor 13 across the controlled rectifier 10 to effect a reverse current flow therein, thereby rendering the rectifier nonconductive. Consider a cycle of operation with control current $I_C=0$, starting just prior to controlled rectifier 10 being rendered conductive in response to a pulse from gating signal source 12. At this instant, the potential of charging capacitor 13 is negative at dot end, and saturable reactor 14 and saturable transformer 15, 16 are in a residual condition of negative and positive saturation, respectively, by reason of the previous cycle of operation. When rectifier 10 is rendered conductive, the potential of capacitor 13 is applied across both saturable reactor 14 and secondary winding 16 of the saturable transformer, thereby drawing a small charging current which will drive reactor 14 towards positive saturation. Upon the charging current driving the saturable reactor into positive saturation, the polarity of the potential of charging capacitor 13 will be immediately reversed and will cause saturable reactor 14 to be charged towards negative saturation due to the oscillatory action of capacitor 13 and saturated inductance of reactor 14. Upon reaching negative saturation, the potential across the capacitor will be applied almost directly to the anode of controlled rectifier 10 due to the fact that impedance of saturated reactor 14 is negligible. This potential will effect a reverse current flow through rectifier 10 which will extinguish conduction through the rectifier. The time interval that the controlled rectifier is maintained conducting is, therefore, determined by the period of time required for saturable reactor 14 to be charged from negative saturation to positive saturation, and then back to negative saturation. This period of time is accurately fixed and dependent upon the parameters of the saturable reactor.

In order to control the time interval that controlled rectifier 10 remains conducting, the circuit comprising saturable transformer 15, 16 and blocking diode 17 is provided. Assuming a maximum control current $I_C$ of about 150 milliamperes is supplied to the primary winding 15 of the saturable transformer, then while saturable reactor 14 is traversing from negative to positive saturation in the previously described cycle of operation, secondary winding 16 of the saturable transformer traverses form negative saturation to just below positive saturation. Upon the saturable reactor 14 reaching positive saturation, the polarity of the potential of capacitor 13 is reversed which instantaneously starts driving the saturable reactor 14 backs towards negative saturation as heretofore described. However, this instantaneous polarity reversal cannot occur with respect to secondary winding 16 of the saturable transformer due to the blocking diode 17 which prevents a current reversal and the secondary winding 16 has to be reset to its negative saturation condition by the control current $I_C$ supplied to the primary winding 15.

The load voltage $E_L$ versus control current $I_C$ characteristic curve for the power amplifier of FIGURE 2 is shown in FIGURE 3. From an examination of this curve, it can be appreciated that reducing control current $I_C$ to some intermediate value, for example, 20 milliamperes, will cause the circuit to operate on the slope of its characteristic curve and the load voltage $E_L$ will be proportionally reduced. The reason for the reduction in load voltage is that the lower value of control current $I_C$ supplied to primary winding 15 of the saturable transformer fails to reset the secondary winding 16 back into negative saturation prior to initiation of the next cycle of operation by the gating signal source 12. As a consequence, upon gating signal source 12 initiating conduction of controlled rectifier 10, the charging current will more quickly drive secondary winding 16 into positive saturation and the polarity of potential across capacitor 13 will be reversed before reactor 14 can reach positive saturation. Reversal of the polarity of the potential of capacitor 13 will, of course, immediately reverse the charging current through saturable reactor 14 so as to start charging this reactor back towards negative saturation, thereby causing it to trace out only a minor hysteresis loop. Of course, upon the saturable reactor 14 reaching negative saturation, the full charge on capacitor 13 will be applied across controlled rectifier 10 causing the reverse current flow which renders the rectifier nonconductive in the previously described manner. The nonconduction will occur in a much shorter time period, however, due to the saturable reactor 14 having traced out only a minor hysteresis loop. The shorter conduction interval, with the fixed repetition rate (smaller ratio of $t_{sc}/t_{so}$) results in a lesser amount of electrical energy being stored within inductor 6, which as a result transfers a lesser amount of electrical energy to load 3, thereby reducing load voltage $E_L$ to a value of about 200 volts, corresponding to a control current of 20 milliamperes as indicated on the characteristic curve. The saturable transformer 15, 16 thus reacts upon saturable reactor 14 and controls the length of time required for reactor 14 to reach negative saturation, the time at which the controlled rectifier is rendered nonconductive.

Figure 4:
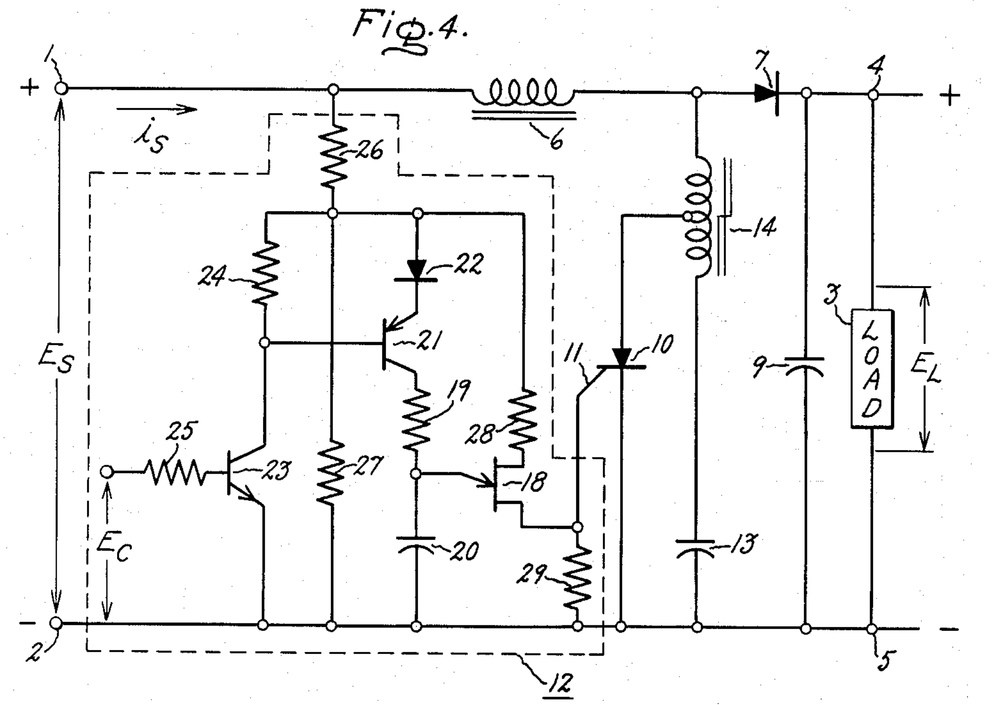
FIGURE 4 is a schematic circuit diagram of the power amplifier circuit shown in FIGURE 1, showing another embodiment of the switching means in detail.

The invention shown in FIGURE 4 discloses another embodiment of a circuit which may conveniently be used for switching means 8 in FIGURE 1. The switching means in FIGURE 4 comprises a circuit which provides a fixed time interval for the conductive state of controlled rectifier 10 and a controllable repetition rate for initiating its conduction. Thus, the gating signal supply 12 is shown in detail as a control circuit in FIGURE 4, whereas, the circuit which renders the control rectifier nonconductive is shown by fixed elements, capacitor 13 and saturable reactor 14 which function in a similar manner as described for FIGURE 2. The circuit of FIGURE 4, therefore, employs a controllable frequency unijunction transistor oscillator with a fixed time interval of controlled rectifier conduction being determined by capacitor 13 and saturable reactor 14. The advantage of this circuit is that the variable frequency control of the unijunction transistor oscillator permits operation down to a very low frequency thereby permitting more accurate control of load voltage $E_L$ at ratios of $E_L/E_S$ approaching unity. This accurate control at low ratios of $E_L/E_S$ cannot be obtained with the control circuit of FIGURE 2 since a minimum period of time is required to render the controlled rectifier nonconductive and the ratio $t_{sc}/t_{so}$ cannot conveniently be made sufficiently small.

The variable gate supply circuit 12 comprises a unijunction transistor 18 which functions as a conventional pulse oscillator that supplies a gating signal to gating electrode 11 of the controlled rectifier 10, thereby rendering it conductive at predetermined times as determined by the frequency of the unijunction transistor oscillator. The oscillation frequency of the unijunction transistor oscillator circuit is determined by the series connected resistor 19 and capacitor 20, the junction of these two elements being connected to the emitter electrode of unijunction transistor 18. The series combination of transistor 21, with its collector electrode being connected to the other end of resistor 19 and diode 22 being connected to the emitter electrode of transistor 21, permit a predetermined charging rate of capacitor 20 to occur, thereby accurately determining the frequency of the unijunction transistor oscillator. This accurate control permits the oscillator to be controlled from zero to at least 3 kilocycles per second, thereby permitting a considerable range of load voltage control as compared to the supply voltage. Transistor 23 in series, with resistor 24 with their junction being connected to the base electrode of transistor 21, act as a potentiometer to determine the conduction state of transistor 21. A control voltage $E_C$ is applied to the base electrode of transistor 23 through current limiting resistor 25 and this control voltage determines the operating point or conduction state of transistor 23 which in turn determines the conduction state of transistor 21, thereby determining the frequency of the unijunction transistor oscillator circuit. If the control voltage $E_C$ is zero, transistor 23 and, hence, transistor 21 will be nonconductive and the frequency of the unijunction transistor oscillator will be zero, thereby developing load voltage $E_L$ equal to supply voltage $E_S$. Diode 22 maintains transistor 21 nonconductive for control voltage $E_C=0$ regardless of any temperature changes within the circuit. As the control voltage $E_C$ is increased positively in magnitude, transistor 23 and, hence, transistor 21 will become more and more conductive, thereby increasing the frequency of the unijunction transistor oscillator. Thus, control voltage $E_C$ controls the frequency of the oscillator which in turn controls load voltage $E_L$. A voltage divider comprised of resistors 26 and 27 provides the proper potential for the transistor circuits and is connected across input terminals 1, 2. Resistor 28 is connected to the base 1 electrode of unijunction transistor 18 and limits the base current of this transistor. The output of the oscillator is developed across resistor 29 which is connected to the junction of base 2 electrode of unijunction transistor 18 and the gating electrode 11 of controlled rectifier 10.

Figure 5:
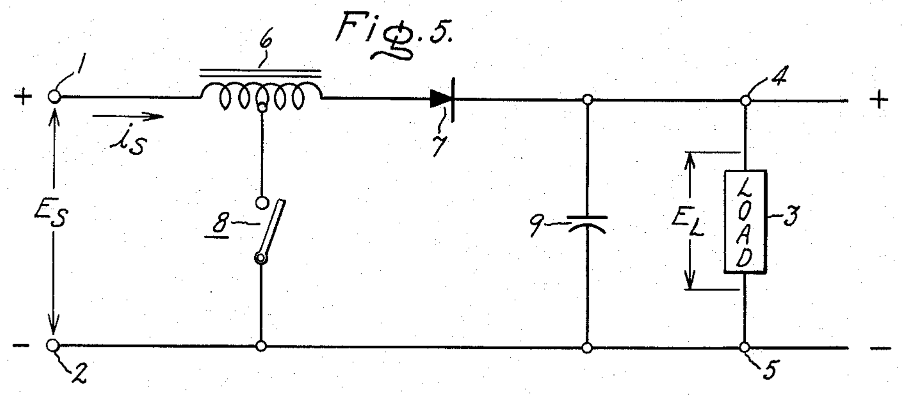
FIGURE 5 is a simplified schematic circuit diagram of a power amplifier circuit constructed in accordance with my invention wherein a higher output voltage may be obtained than in the circuit of FIGURE 1.

FIGURE 5 illustrates a modification of the simplified schematic circuit illustrated in FIGURE 1 whereby a load voltage $E_L$ much greater than the supply voltage $E_S$ may be obtained. Although the circuit of FIGURE 1 may be used to develop load voltages greater than twice the supply voltage $E_S$, this load voltage which is also effectively across switching means 8 could be excessive and exceed the peak voltage rating of the semiconductor elements within the switching means 8 circuit. The use of a tap on inductor 6 reduces this peak voltage across switching means 8, thereby permitting the control of load voltage $E_L$ to several times the supply voltage $E_S$. A load voltage of at least 750 volts for a supply voltage $E_S$ of 125 volts is easily obtainable by employing a tapped inductor.

From the foregoing description, it can be appreciated that my invention makes available a new and improved power amplifier circuit wherein an output or load voltage can be developed to be greater than the supply voltage, without utilizing a conventional power transformer, and wherein accurate control can be exercised over the operation of a switching means to provide this higher load voltage.

Having described two embodiments of a simplified circuit which comprises the power amplifier and two embodiments of a specific switching means that may be employed within the power amplifier, constructed in accordance with my invention, it is believed obvious that other modifications and variations of my invention are possible in light of the above teachings. For example, the power amplifier circuit is not restricted to use with a direct current power supply but may also be used with an alternating current power supply since diode 7 and controlled rectifier 10 would provide rectification of alternate half-cycles of alternating current potential. Both half-cycles of an alternating current potential supply could be utilized for developing the load voltage by using a conventional full wave rectifier bridge at the input terminals. An alternating current load voltage could also be obtained by appropriately interconnecting two circuits of the type illustrated in FIGURE 1 to a common load. Although the amplifier provides a load voltage which is directly proportional to the supply voltage, feedback means may be employed to regulate a constant load voltage. Also, the associated control circuitry with the conventional controlled rectifier switching device may be a combination of both the circuits illustrated in FIGURES 2 and 4, thereby providing an even finer control of load voltage. It is, therefore, to be understood that changes may be made in the particular embodiment of my invention described which are within the full intended scope of the invention as defined by the following claims.

What I claim as new and desire to secure by Letters Patent of the United States is:

1. An electrical power supply circuit comprising a linear inductor, and a pair of output terminals connected in series circuit relationship in the order named across a pair of input power supply terminals that in turn are adapted to be connected across a source of electric potential, said output terminals adapted to be connected to a load, a gate turn-on, nongate turn-off controlled conducting solid state semiconductor device adapted to be alternately conducting and nonconducting for predetermined time intervals, said device being connected in series circuit relationship with said linear inductor in parallel circuit relationship with the output terminals, and means for gating on said device at a desired frequency to produce the predetermined time intervals of conduction, commutating means for turning off said device after a predetermined interval of conduction, said commutating means including a commutating capacitor and circuit means operatively coupling said commutating capacitor in series circuit relationship with said linear inductor for charging said commutating capacitor to a voltage greater than the supply voltage during non-conducting intervals of the controlled solid state semiconductor device, the ratio of conducting to nonconducting time intervals of the controlled semiconductor device determining the magnitude of a continuous direct current output voltage generated across said output terminals.

2. The electrical power supply circuit set forth in claim 1 further characterized by a filter capacitor connected in parallel circuit relationship with the output terminals and rectifying means connected in series circuit relationship with the linear inductor and the parallel connected filter capacitor and output terminals.

3. The electrical power supply circuit set forth in claim 1 wherein the linear inductor has an intermediate tap point and the gate turn on, non-gate turn off controlled conducting solid state semiconductor device is connected to the intermediate tap point.

4. The power supply circuit set forth in claim 1 wherein the commutating means includes a saturable reactor having an intermediate tap point with the saturable reactor being connected in series circuit relationship with the linear inductor and the commutating capacitor.

References Cited by the Examiner

UNITED STATES PATENTS

| | | | |
|---|---|---|---|
| 2,605,310 | 7/1952 | White | 320—1 X |
| 3,013,165 | 12/1961 | Bataille | 320—1 X |
| 3,122,677 | 2/1964 | Flieder | 320—1 X |

BERNARD KONICK, *Primary Examiner.*

IRVING L. SRAGOW, *Examiner.*

P. F. ROTH, R. J. McCLOSKEY, *Assistant Examiners.*